(12) United States Patent
Chen et al.

(10) Patent No.: US 8,564,970 B2
(45) Date of Patent: Oct. 22, 2013

(54) DISPLAY SUBSTRATE HAVING ARCHED SIGNAL TRANSMISSION LINE

(75) Inventors: Hung-Kun Chen, Hsin-Chu (TW); Chi-Chin Lin, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 525 days.

(21) Appl. No.: 12/723,321

(22) Filed: Mar. 12, 2010

(65) Prior Publication Data

US 2010/0302750 A1  Dec. 2, 2010

(30) Foreign Application Priority Data

May 27, 2009  (TW) .............................. 98117621 A

(51) Int. Cl.
*H05K 1/11* (2006.01)
*H05K 1/14* (2006.01)

(52) U.S. Cl.
USPC ........... 361/792; 361/749; 361/777; 361/780; 174/254; 174/258

(58) Field of Classification Search
USPC .......................... 361/749–750; 174/254–258; 349/149–150
See application file for complete search history.

(56) References Cited

U.S. PATENT DOCUMENTS

| | | | |
|---|---|---|---|
| 5,155,612 A * | 10/1992 | Adachi et al. | 349/111 |
| 5,680,191 A * | 10/1997 | Voisin et al. | 349/150 |
| 6,982,569 B2 | 1/2006 | Lee et al. | |
| 8,045,119 B2 | 10/2011 | Huang et al. | |
| 2006/0067143 A1 | 3/2006 | Kim | |

FOREIGN PATENT DOCUMENTS

| | | |
|---|---|---|
| TW | 548821 | 8/2003 |
| TW | 95129513 | 4/2007 |
| TW | 200842472 | 11/2008 |

\* cited by examiner

*Primary Examiner* — Tuan T Dinh
(74) *Attorney, Agent, or Firm* — Muncy, Geissler, Olds & Lowe, PLLC

(57) ABSTRACT

This invention discloses a display device mother substrate, a display device substrate and a manufacture method of display device substrate thereof. The display device mother substrate includes a first substrate, a second substrate, a first active area circuit and a first transmission line, wherein a first cutting line is defined between the first substrate and the second substrate. The first active area circuit is disposed on the first substrate and is electrically connected to the first transmission line. The first transmission line includes a display line portion, an end line portion and a middle line portion, wherein the display line portion is electrically connected to the first active area circuit. The middle line portion is disposed on the second substrate, wherein two ends of the middle line portion are electrically connected to the display line portion and the end line portion respectively at the first cutting line. The display device mother substrate is cut along the first cutting line to be separated into the first substrate and the second substrate, wherein the middle line portion is also separated from the display line portion and the end line portion.

9 Claims, 8 Drawing Sheets

DISPLAY SUBSTRATE HAVING ARCHED SIGNAL TRANSMISSION LINE

BACKGROUND OF THE INVENTION

1. Field of the Invention

This invention relates to a display substrate having an arched signal transmission line and a manufacture method thereof; and more specifically to a liquid crystal display substrate having an arched signal transmission line and a manufacture method thereof.

2. Description of the Prior Art

Flat display panels and the flat display devices using the flat display panels are now the mainstream display devices on the market; especially the liquid crystal display panels are extensively used in display devices for electronic products such as home flat television, flat monitors of personal computers and laptop computers, display screens of mobile phones and digital cameras.

In order to transmit image data, a plurality of signal transmission lines are disposed on the surface of a flat display substrate. FIG. 1 is a top view of a conventional flat display substrate. As FIG. 1 shows, the conventional display substrate includes a first panel substrate 10 and a second panel substrate 20, wherein the panel substrates 10, 20 will be separated at the separation line 40 after a panel performance test is completed. A test line 50 and an active area (or namely pixel area, or namely display area) 12 are disposed on the surface of the first panel substrate 10. During the performance test, the test line 50 accepts test signals from probes (not illustrated) and then transmits the test signals to the active area 12. The test signals simulate the signals during normal operation and drive the active area 12 to inspect whether the display panel can function normally.

As FIG. 1 shows, due to the layout requirement of the display panel, part of the test line 50 overlaps the signal line 60, wherein the signal line 60 is used to transmit electrical signals during normal operation. As FIG. 1 shows, the test line 50 and the signal line 60 overlap and thus parasitic capacitance exists between the test line 50 and the signal line 60. Thus, in the performance test, part of the test signal will be transformed into static charges and stored in the parasitic capacitance between the test line 50 and the signal line 60. After the display panel passes the performance test and starts normal operations, the stored static charges which are accumulated to a certain level may be discharged and damage the protection layer and the insulation layer between the test line 50 and the signal line 60. In this way, electrical signals cannot be correctly transmitted due to short-circuit and thus the display panel cannot correctly display desired images.

SUMMARY OF THE INVENTION

It is an object of the present invention to provide a display substrate having an arched signal transmission line to avoid the accumulation of static charges between a signal test line and a signal transmission line.

It is another object of the present invention to provide a display substrate having an arched signal transmission line to prevent the short-circuit between the signal test line and the transmission line from interfering the accuracy of the images displayed by the display panel.

It is yet another object of the present invention to provide a display substrate having an arched signal transmission line avoid short-circuit between signal test line and a signal transmission line to improve the reliability of the display panel.

The display substrate of the present invention includes a first substrate, a second substrate, a first transmission line, a second transmission line, and a signal test pad. A first cutting line is defined between the first substrate and the second substrate and the two substrates are disposed with a first active area circuit and a second active area circuit, respectively. Two ends of the first transmission line are electrically connected to the signal test pad and the first active area, respectively. The signal test pad accepts test signals from a probe and transmits the test signals to the first active area circuit via the first transmission line for the first active area circuit to display images accordingly. The first transmission line includes at least three line portions. Two ends of the middle line portion are electrically connected to the display line portion and the end line portion, respectively. One end of the end line portion is connected to the signal test pad and the one end of the display line portion is connected to the first active area circuit. The middle line portion is disposed on the second substrate, wherein two ends of the middle line portion are respectively connected to the display line portion and the end line portion at the first cutting line. Furthermore, after the panel performance test is performed, the first substrate and the second substrate will be separated by cutting along the first cutting line. In other words, the display substrate is separated into at least the first substrate and the second substrate, and simultaneously the middle line portion is separated from the end line portion and the display line portion.

The second transmission line is disposed on the display substrate, wherein the second transmission line crosses over the first cutting line and is disposed on both the first substrate and the second substrate. In one embodiment, part of the end line portion and the second transmission line overlap the therefor parasitic capacitance is created between the end line portion and the second transmission line. In this way, there may be static charges accumulated in the parasitic capacitance due to test signals even after the panel performance test is completed. The static charges can be accumulated and discharged when reaching a certain level to destroy the protective layer and the insulation layer between the end line portion and the second transmission line. In this way, the exposed signal line may short-circuit the test line. However, after the first substrate and the second substrate are separated, the middle line portion is also separated from the end line portion and the display line portion and thus the end line portion is also separated and electrically disconnected from the display line portion. Thus even if the end line portion short-circuit the second transmission line due to electrostatic discharge, the first active area circuit will not receive electrical signals from the second transmission line and inaccurately display of images can be prevented.

Furthermore, the middle line portion is disposed on the second substrate and forms an arch, wherein a rectangular space is enclosed on the second substrate by the middle line portion and the first cutting line, but is not limited thereto. In different embodiments, the above-mentioned space can be circular, triangular, angle, taper, or other suitable shapes by adjusting the layout of the middle line portion.

DETAILED DESCRIPTION OF THE PREFERRED EMBODIMENT

The present invention discloses a display substrate having an arched signal transmission line and a manufacture method thereof, for preventing the accumulation of static charges between a test line and the signal transmission line. The present invention can also prevent damage to the protective layer of the signal transmission line due to electrostatic discharge. In this way, the present invention can also prevent the test line and the signal transmission line from short-circuiting each other and ensures the display of correct images. Furthermore, the display substrate of the present invention also includes a glass substrate of the liquid crystal display panel, but is not limited thereto, and can also include other soft or rigid substrates as appropriate. In different embodiments, the above-mentioned display panels can be classified according to different display mode and film design, such as transmissive display panels, transflective display panels, reflective display panels, color-filter-on-array display panels, array-on-color-filter display panels, vertical alignment (VA) display panels, In-plane-switching (IPS) display panels, multi-domain vertical alignment (MVA) display panels, twisted nematic (TN) display panels, super twisted nematic (STN) display panels, pattern vertical alignment (PVA) display panels, super pattern vertical alignment (S-PVA) display panels, advanced super view (ASV) display panels, fringe-field-switching (FFS) display panels, continuous pinwheel alignment (CPA) display panels, axially symmetrical aligned microcell (ASM) display panel, optically compensated bend (OCB) display panel, super in-plane-switching (S-IPS) display panels, advanced super in-plane switching (AS-IPS) display panels, ultra fringe field switching (UFFS) display panels, polymer-stabilized Alignment type (PSA) display panels, dual-view display panels, triple-view display panels, three-dimensional (3D) display panels, touch panels, organic light emitting diode (OLED) display panels, low temperature poly-silicon (LTPS) display panels, plasma display panels (PDP), flexible display or other types of panels, or combinations thereof.

Figure 1:
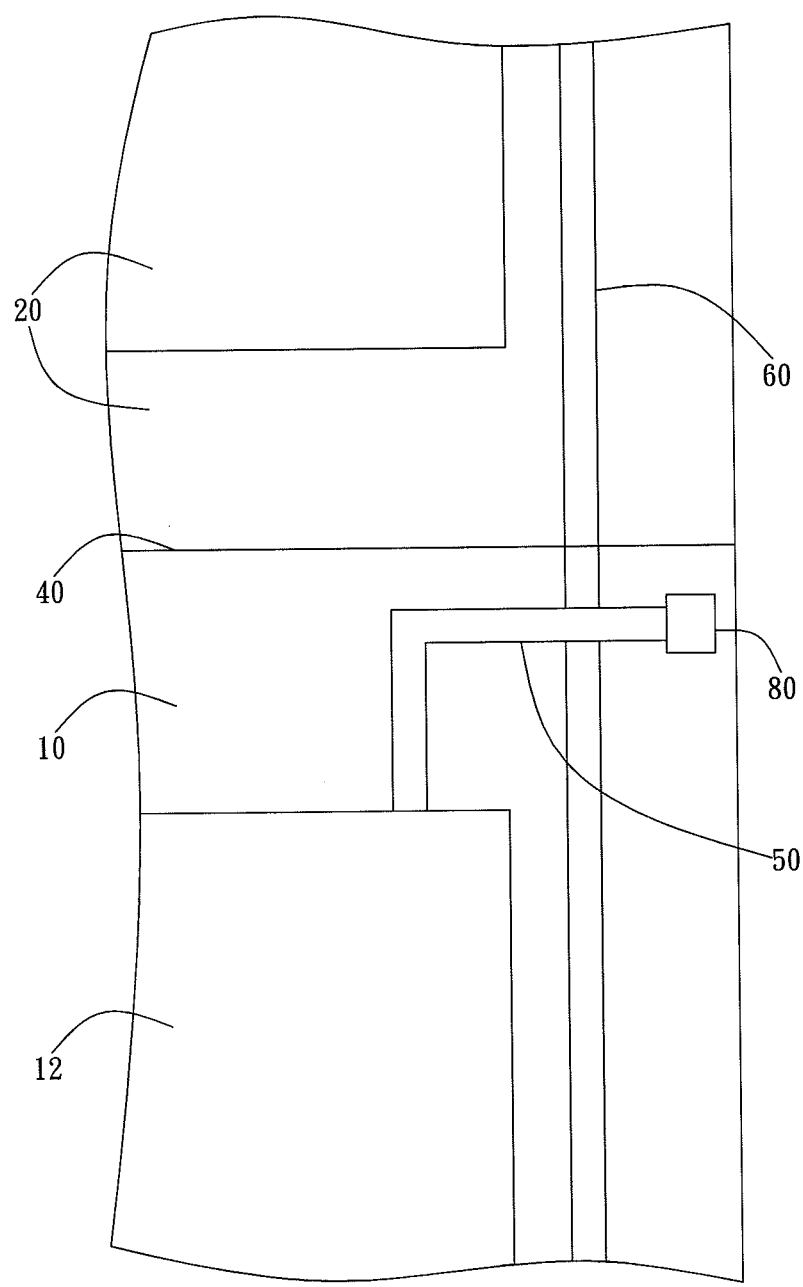
FIG. 1 is a top view of a conventional flat display substrate.
Figure 2A:
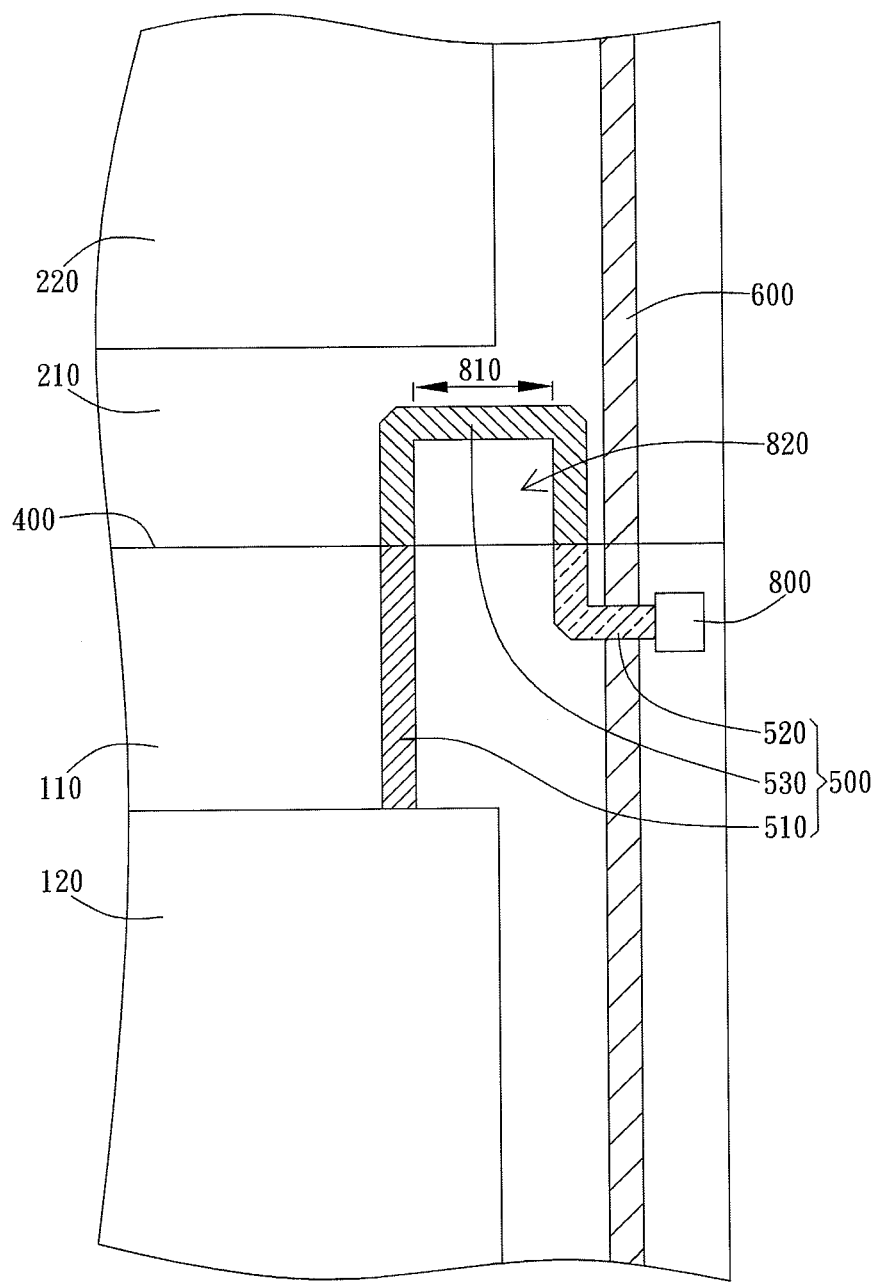
FIG. 2A is a top view of a display substrate of the present invention.

FIG. 2A is a top view of the display substrate of the present invention. In the present embodiment, the display substrate is a display device mother substrate 100 including a first substrate 110, a second substrate 210, a first transmission line 500, a second transmission line 600 and signal test pad 800, wherein the signal test pad 800 is used to accept test signals from probes (not illustrated) during a panel performance test. The display device mother substrate 100 of the present embodiment is a glass substrate and a first cutting line 400 is disposed between the first substrate 110 and the second substrate 210. Two substrates 110, 210 are disposed with a first active area 120 and a second active area 220, respectively. Wherein, the active area is also namely the pixel area or the display area. The first active area 120 and the second active area 220 have a first active area circuit (not illustrated) and a second active area circuit (not illustrated), respectively. In the present embodiment, the display device mother substrate 100 includes only the first substrate 110 and the second substrate 210, but is not limited thereto; in other embodiments, the display device mother substrate 100 can also include other number of substrates. Furthermore, after the performance test is completed, the first substrate 110 and the second substrate 210 are separated by cutting the display device mother substrate 100 along the first cutting line 400. In other words, the first cutting line 400 is a reference line for cutting the display device mother substrate 100 into separate substrates. The display device mother substrate 100 will be separated into the first substrate 110 and the second substrate 210.

As shown in FIG. 2A, the first transmission line 500 includes at least three segments, i.e. a display line portion 510, an end line portion 520, and a middle line portion 530, wherein the display line portion 510 and the end line portion 520 are located on the first substrate 110 while the middle line portion 530 is disposed on the second substrate 210. Two ends of the middle line portion 530 are electrically connected to the display line portion 510 and the end line portion 520, respectively. Two ends of the end line portion 520 are electrically connected to the signal test pad 800 and the middle line portion 530, respectively. Test signal from the signal test pad 800 is transmitted to the first active area 120 via the first transmission line 500 for the first active area 120 to display images according to the test signal. In other words, the test signal is used to simulate the normal operation of the first substrate 110 and to inspect whether the first substrate 110 can display images properly.

As FIG. 2A shows, the second transmission line 600 is disposed on the display device mother substrate 100, wherein the second transmission line 600 crosses over the first cutting line 400 to be located on both the first substrate 110 and the second substrate 210. As FIG. 2A shows, part of the end line portion 520 overlaps the second transmission line 600, wherein the end line portion 520 is perpendicular to the second transmission line 600 and partially overlaps the second transmission line 600, but is not limited thereto. In different embodiments, the end line portion 520 can overlap the second transmission line 600 in different orientation, or the second transmission line 600 can be disposed over the end line portion 520 or the middle line portion 530. Furthermore, in the present embodiment, the second transmission line 600 is used to transmit the test signal, but is not limited thereto. In other embodiments, the second transmission line 600 can transmit other electrical signals during panel performance test or normal operation. Furthermore, the middle line portion 530 and the first cutting line 400 encloses a rectangular space 820 having a space width 810, wherein the space width 810, the width of the middle line portion 530, and the dimension of the space 820 can be adjusted according to the layout requirement.

As FIG. 2A shows, two ends of the middle line portion 530 are adjacent to the first cutting line 400 and electrically connected to the display line portion 510 and the end line portion 520. Due to the fact that the end line portion 520 is disposed over the second transmission line 600, a parasitic capacitance exists between the end line portion 520 and the second transmission line 600. During the performance test, static charges may be accumulated between the end line portion 520 and the second transmission line 600. The static charges may be discharged when reaching a certain level and may damage the protective layer and the insulation layer between of the end line portion 520 and the second transmission line 600 to short-circuit the end line portion 520 and the second transmission line 600. In this way, the electrostatic discharge may cause the first transmission line 500 and the second transmission line 600 to short-circuit and disrupt the signals transmitted. According to the embodiments of the present invention, when the first substrate 110 and the second substrate 210 are separated by cutting along the first cutting line 400, the middle line portion 530 will also be separated from the display line portion 510 and the end line portion 520. Thus, even if the second transmission line 600 short-circuits the end line portion 520, the second transmission line 600 will not short-circuit the first active area 120 after the first substrate 110 is separated from the second substrate 210. In this way, signal distortion due to short-circuit between signal lines can be avoided. In the embodiment illustrated in FIG. 2A, the end line portion 520 crosses over the second transmission line 600 to electrically couple with the signal test pad 800. Furthermore, the first transmission line 500 is disposed on both the first substrate 110 and the second substrate 210 in an arched shape. In the present embodiment, the middle line portion 530 forms a rectangular arch on the second substrate 210; in other words, the middle line portion 530 and the first cutting line 400 enclose a rectangular space on the second substrate 210, but is not limited thereto; in different embodiments, the middle line portion 530 and the first cutting line 400 can enclose a space in of other suitable shapes according to the layout requirements.

Figure 2B:
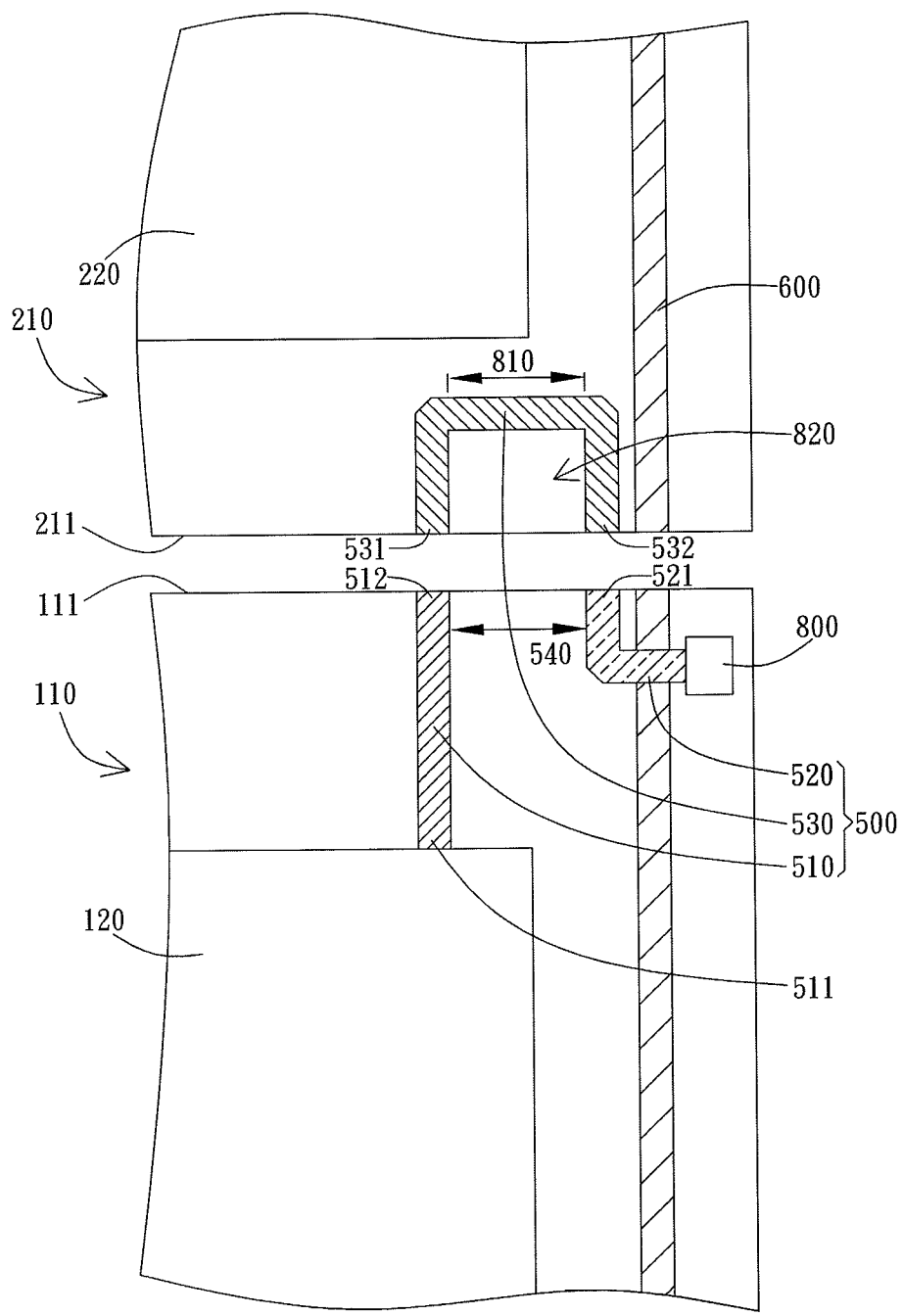
FIG. 2B is a first substrate and a second substrate illustrated in FIG. 2A.

FIG. 2B illustrates the first substrate 110 and the second substrate 210 separated from each other, wherein the two substrates 110, 210 are obtained by cutting the display device mother substrate 100 along the first cutting line 400. As FIG. 2B shows, the display line portion has a first end 511 and a second end 512, wherein the first end 511 is electrically connected to the active area circuit 120. The second end 512 extends to be exposed outside a first edge 111 of the first substrate 110. The middle line portion 530 is separated from the end line portion 520 and the display line portion 510 when the first substrate 110 is separated from the second substrate 210. In other words, the end line portion 520 is electrically disconnected from the display line portion 510 when the two substrates 110, 210 are separated. Thus a third end 521 of the end line portion 520 extends to be exposed outside the first edge 111 of the first substrate 110 and a gap 540 exists between the second end 512 of the display line portion 510 and the third end 521 of the end line portion 520. Furthermore, as FIG. 2B shows, the middle line portion 530 is disposed circuitously on the second substrate 210, wherein the middle line portion 520 includes a fourth end 531 and a fifth end 532 extending to be exposed outside a second edge 211 of the second substrate 210, respectively. Thus, when the two substrates 110, 210 are separated, the fourth end 531 and the fifth end 532 are also separated from the display line portion 510 and the end line portion 520 of the first substrate 110, respectively.

For this reason, even if the end line portion 520 short-circuits the second transmission line 600 due to electrostatic discharge, signals to the circuit of the first active area 120 will not be distorted because the display line portion 510 is electrically disconnected from the middle line portion 530 and the end line portion 520. In other words, the second transmission line 600 can cross over the entire first transmission line 500 except the display line portion 510.

Figure 3:
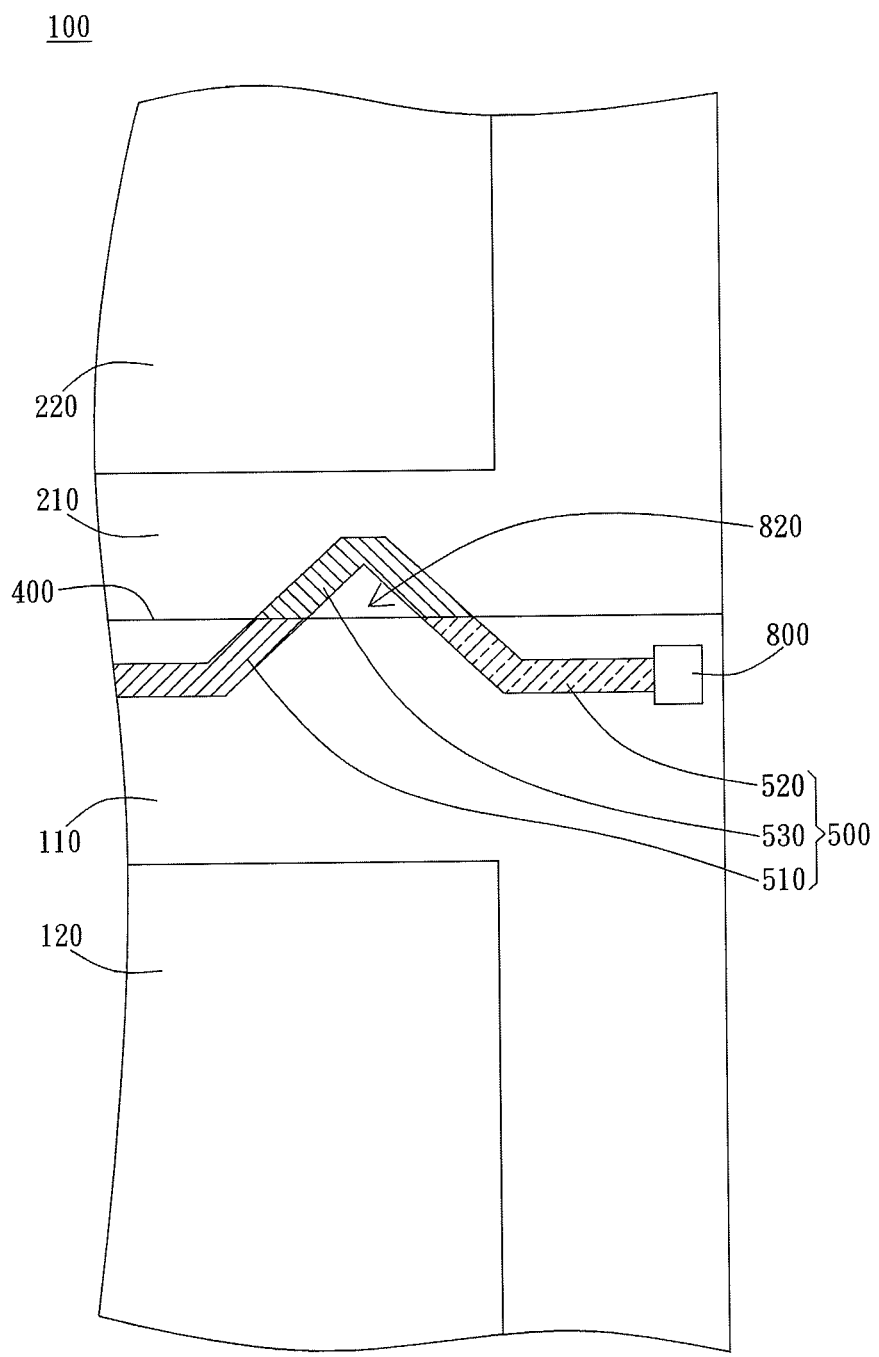
FIG. 3 illustrates a modification of the display substrate in FIG. 2A.

FIG. 3 illustrates a modification of the display substrate illustrated in FIG. 2A. In the embodiment illustrated in FIG. 3, part of the first transmission line 500 is disposed along the first cutting line 400, wherein the middle line portion 530 and the first cutting line 400 forms a triangular space 820 on the second substrate 210. In other words, the triangular space 820 is enclosed on the second substrate 210, but is not limited thereto. In different embodiments, the shape of the space 820 can be changed by adjusting the layout of the display device mother substrate 100.

Figure 4A:
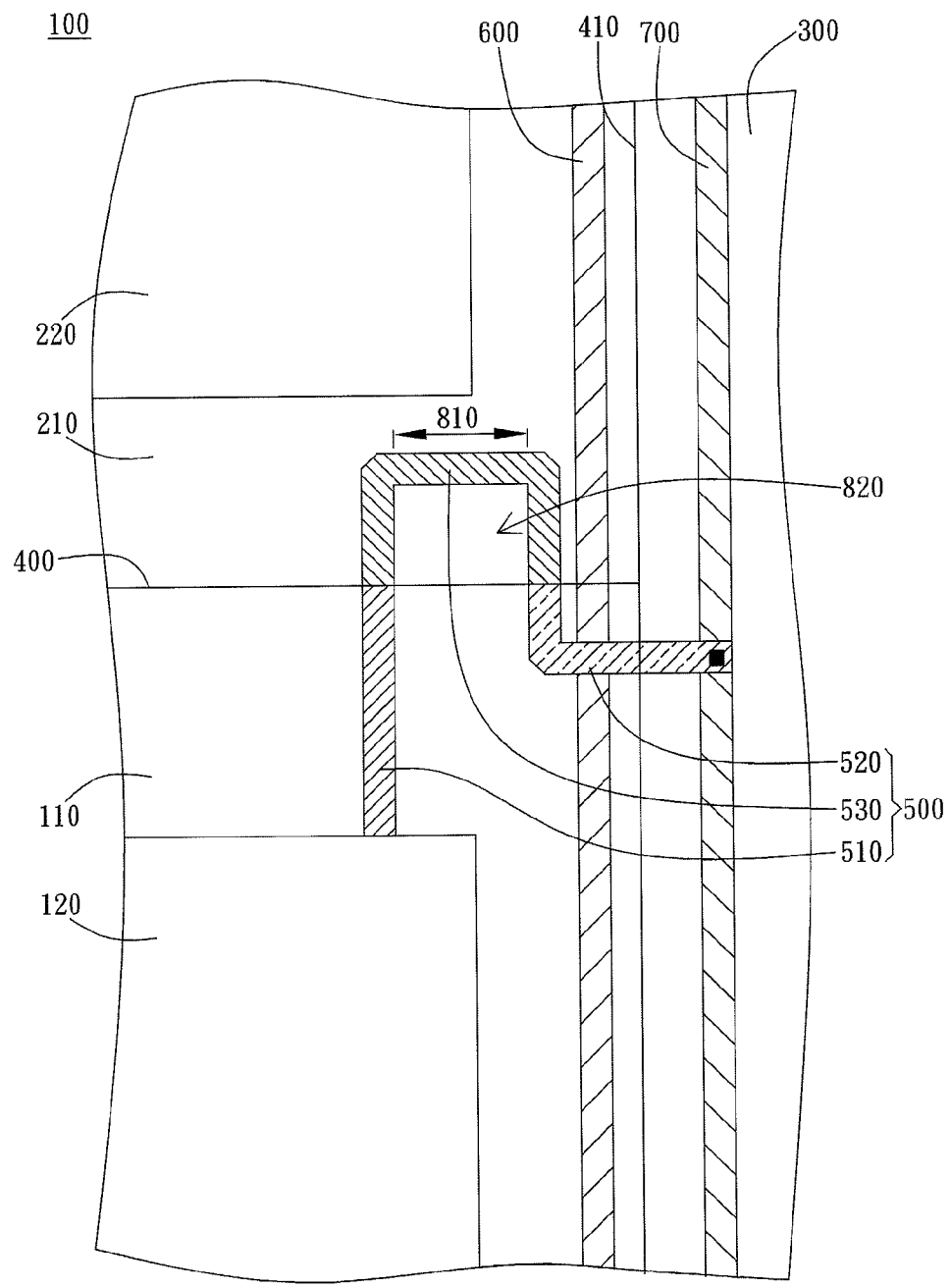
FIG. 4A illustrates another modification of the display substrate illustrated in FIG. 2A.

FIG. 4A illustrates yet another modification of the display device mother substrate 100 illustrated in FIG. 2A. In the present embodiment, the display device mother substrate 100 further includes a third substrate 300 adjacent to the first substrate 110 and the second substrate 210, wherein a second cutting line 410 is located between the third substrate 300 and the substrates 110, 210. A third transmission line 700 is disposed on the third substrate 300 which is substantially parallel to the second transmission line 600. The third transmission line 700 is electrically connected to the end line portion 520 of the first transmission line 500. In the present embodiment, the third transmission line 700 is electrically connected to a signal test pad (not illustrated) for accepting test signals and transmits the test signals from the first transmission line 700 to the first active area 120 of the first substrate 110 for the first active area 120 to display images accordingly.

Figure 4B:
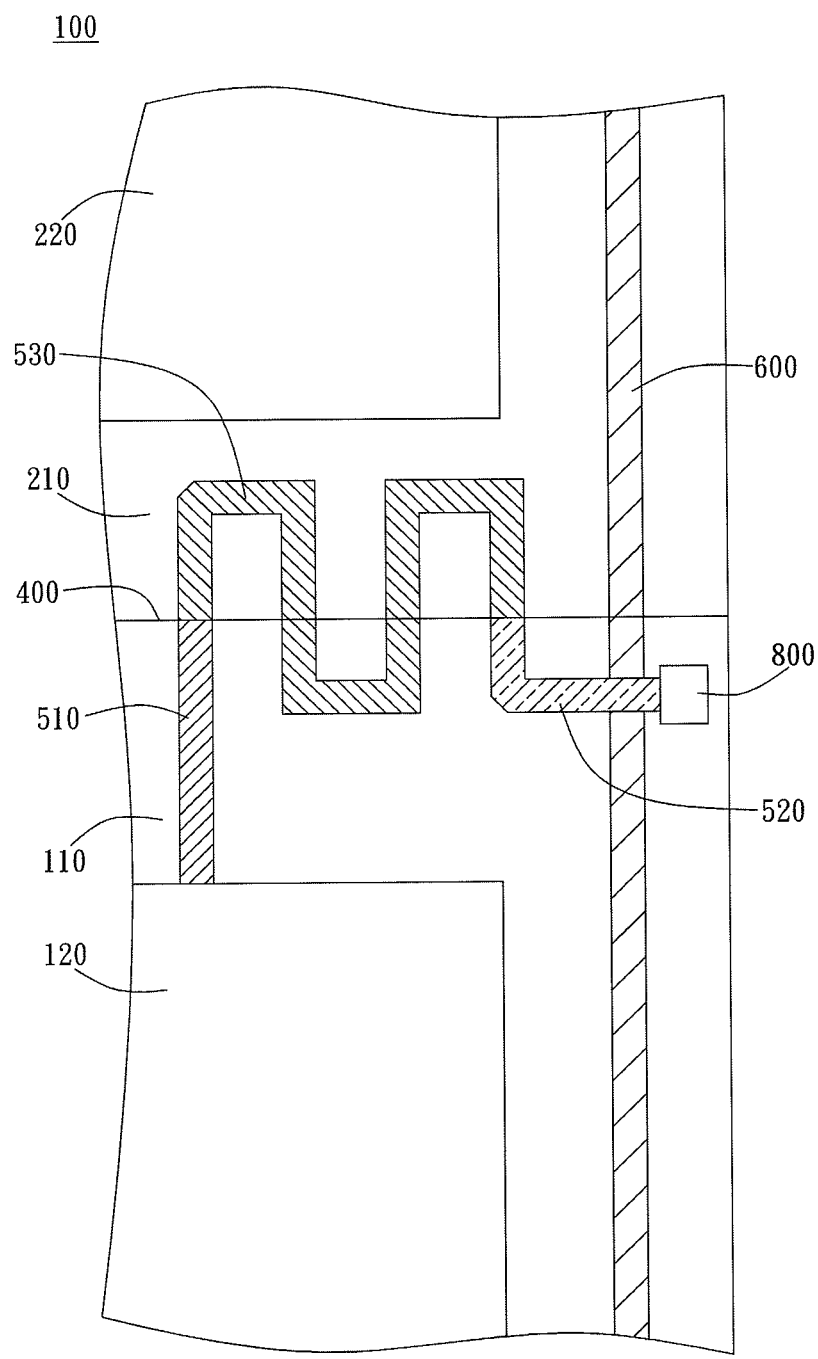
FIG. 4B illustrates yet another modification of the display substrate illustrated in FIG. 2A.

In the present embodiment, the first substrate 110 and the second substrate 210 are separated from the third substrate 300 by cutting along the second cutting line 410. Furthermore, the first substrate 110 and the second substrate 210 are separated by cutting along the first cutting line 400. Thus, the end line portion 520 will be separated from the third transmission line 700 and the middle line portion 530. Even if the end line portion 520 short-circuits the second transmission line 600 due to electrostatic discharge, the first active area 120 will not display inaccurate images caused by the electrical signals from the second transmission line 600. FIG. 4B illustrates another embodiment of the display device mother substrate 100. In the present embodiment, the middle line portion 530 of the first transmission line 500 is repeatedly bent and disposed on the first substrate 110 and the second substrate 210 with the end line portion 520 partially overlapping the second transmission line 600. In the present embodiment, the second transmission line 600 and the third transmission line 700 are respectively electrically connected to signal test pads (not illustrated) to receive test signals, wherein the second transmission line 600 transmit the test signals elsewhere while the transmission line 700 transmits the test signals to the first active area 120 via the first transmission line 500, but are not limited thereto; in different embodiments, the second transmission line 600 and third transmission line 700 can be used to transmit other electrical signals.

Figure 5:
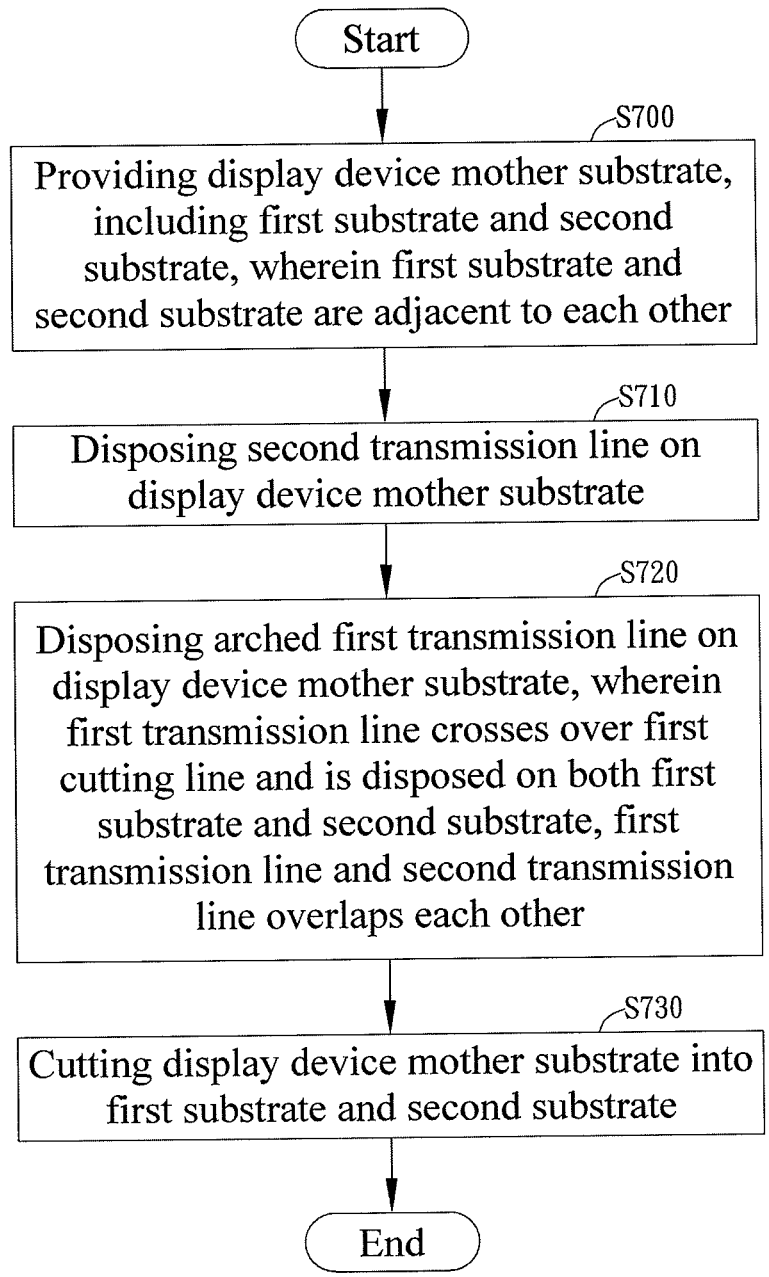
FIG. 5 is a flow chart illustrating a manufacture method of the display mother substrate illustrated in FIG. 2A.

FIG. 5 is a flow chart illustrating a manufacture method of the display device mother substrate 100 illustrated in FIG. 2A. As FIG. 5 shows, step S700 includes providing a display device mother substrate, such as a glass substrate, including a first substrate and a second substrate, wherein the first substrate is disposed with an active area for displaying images. The first substrate and the second substrate are adjacent to each other, but are not limited thereto. The above-mentioned first substrate and second substrate are substantially part of the display device mother substrate and a first cutting line is defined between the two substrates. In the present embodiment, the display device mother substrate includes two sub-substrates such as the first and second substrates, but is not limited thereto; in different embodiments, the display device mother substrate can include other number of sub-substrates as appropriate. In the present embodiment, the first substrate is a glass substrate used in liquid crystal display, wherein the active area disposed on the first substrate includes thin-film transistors, color filters, image driver, signal test pads and an active area circuit, but is not limited thereto; in different embodiments, the active area can include organic light emitting diode or other elements and the second substrate may also include an active area.

As FIG. 5 shows, step S710 of the manufacture method includes disposing a second transmission line on the display device mother substrate. In the present embodiment, the second transmission line crosses over the first cutting line between the first substrate and the second substrate and is disposed on both the first substrate and the second substrate.

Step S720 illustrated in FIG. 5 includes disposing an arched first transmission line on the display device mother substrate, wherein the first transmission line crosses over the first cutting line and is disposed on both the first substrate and the second substrate. The first transmission line includes a display line portion, an end line portion, and a middle line portion, wherein two ends of the middle line portion are connected to the display line portion and the end line portion, respectively. In the present embodiment, the display line portion is electrically connected to the active area circuit while the end line portion is electrically connected to a signal test pad which accepts test signals from a probe. In other words, during a performance test, the first transmission line can accept test signals from the probe and then transmit the test signals to the active area circuit, but is not limited thereto. In different embodiments, the end line portion is electrically connected to an image driving element or other electrical elements. The display line portion and the end line portion are disposed substantially on the first substrate and the middle line portion is disposed substantially on the second substrate. In addition, the middle line portion is connected to both the display line portion and the end line portion at the first cutting line between the first substrate and the second substrate.

In the embodiment illustrated in FIG. 5, step 720 includes disposing the first transmission line on top of the second transmission line. In other words, the first transmission line and the second transmission line overlaps each other in a cross manner on the display device mother substrate. In the present embodiment, the second transmission line perpendicular to the end line portion of the first transmission line and partially overlaps the end line portion, but is not limited thereto. In different embodiments, the second transmission line can cross over other portions of the first transmission line such as the middle line portion, or the two transmission lines can overlap each other in a slanted manner at any angle as appropriate.

Furthermore, in step S720 illustrated in FIG. 5, the middle line portion of the first transmission line is disposed circuitously on the second substrate. In the present embodiment, the middle line portion on the second substrate is arched, wherein a space exists between the middle line portion and the first cutting line. In one modification of the present invention, the middle line portion is adjusted to have a triangular shape on the second substrate, wherein a triangular space is enclosed between the middle line portion and the first cutting line, but is not limited thereto; in different embodiments, the middle line portion can be adjusted according to layout requirement to have other shapes.

Step S730 in FIG. 5 includes cutting the display device mother substrate into the first substrate and the second substrate, wherein the display device mother substrate is cut along the first cutting line. In other words, the first cutting line is used as a reference line for cutting the display device mother substrate. The middle line portion is electrically connected to the display line portion and the end line portion at the first cutting line, thus step S730 also separates the middle line portion from the display line portion and the end line portion when cutting the display device mother substrate.

Figure 6:
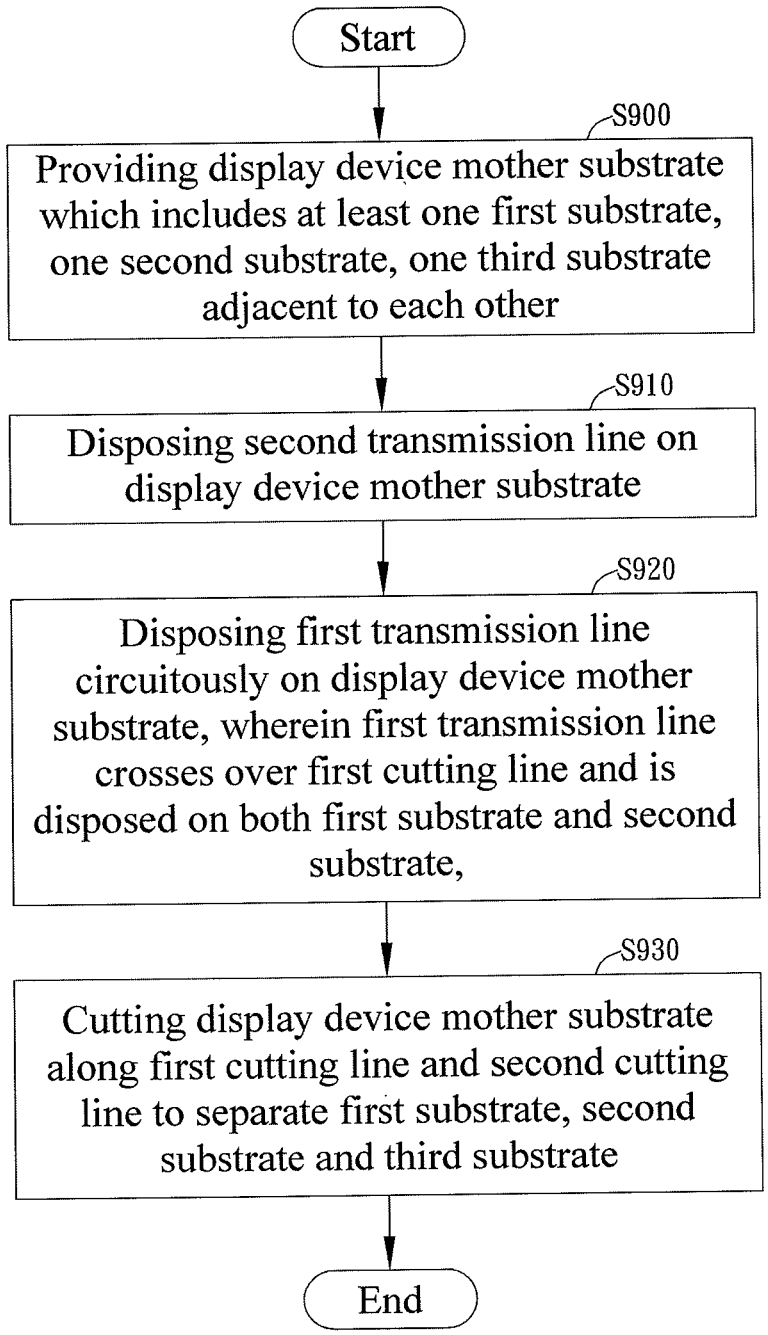
FIG. 6 is a flow chart of a manufacture method of the display device mother substrate illustrated in FIG. 4A.

Furthermore, FIG. 6 is a flow chart of a manufacture method of the display device mother substrate 100 illustrated in FIG. 4A. As FIG. 6 shows, step S900 includes providing a display device mother substrate which at least includes one first substrate, one second substrate, one third substrate, wherein the first substrate is disposed with an active area, but is not limited thereto. The first substrate, the second substrate, and the third substrate are adjacent, but are not limited thereto. For instance, the third substrate is adjacent to both the first substrate and the second substrate, wherein a second cutting line exists between the substrates. Furthermore, the display device mother substrate is a glass substrate, but is not limited thereto; in different embodiments, the display device mother substrate can be a plastic substrate or substrates made of other materials.

As FIG. 6 shows, the manufacture method includes step S910 of disposing a second transmission line on the display device mother substrate. In the present embodiment, the second transmission line crosses over the first cutting line between the first substrate and the second substrate and is disposed on both the first substrate and the second substrate. Step S910 can also include disposing a third transmission line on the third substrate of the display device mother substrate, wherein the third transmission line is parallel to the second transmission line.

Step S920 includes disposing a first transmission line circuitously on the display device mother substrate, wherein the first transmission line crosses over the first cutting line and is disposed on both the first substrate and the second substrate. The first transmission line includes a display line portion, an end line portion, and a middle line portion, wherein two ends of the middle line portion are connected to the display line portion and the end line portion, respectively. Furthermore, step S920 illustrated in FIG. 6 includes disposing part of the end line portion on the third substrate, wherein the end line portion crosses over the second cutting line and electrically connects with the third transmission line.

Step S930 illustrated in FIG. 6 includes cutting the display device mother substrate along the first cutting line and the second cutting line to separate the first substrate, the second substrate and the third substrate. The middle line portion is connected to the display line portion and the end line portion at the first cutting line and thus step S930 also separates the middle line portion from the display line portion and the end line portion. Furthermore, step S930 also includes cutting off the end line portion when separating the first substrate from the third substrate along the second cutting line.

The above is a detailed description of the particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A display device mother substrate, comprising:
a first substrate with an active area circuit disposed thereon;
a second substrate connected to the first substrate; and
a first transmission line, disposed circuitously on the first substrate and the second substrate, wherein the first transmission line comprising:
a display line portion disposed on the first substrate and electrically connected to the active area circuit;
an end line portion disposed on the first substrate; and
a middle line portion disposed on the second substrate, wherein the middle line portion is connected between the display line portion and the end line portion;
wherein when the first substrate and the second substrate are separated, the middle line portion is separated to electrically disconnect the display line portion from the end line portion; and a second transmission line, disposed on both the first substrate and the second substrate, wherein the second transmission line and the end line portion of the first transmission line at least partially cross over each other on the first substrate.

2. The display device mother substrate of claim 1, wherein the middle line portion bends and forms an arch between two ends thereof on the second substrate.

3. The display device mother substrate of claim 1, wherein the middle line portion bends to form an angle between two ends thereof on the second substrate.

4. The display device mother substrate of claim 1, further comprising a third substrate connected to the first substrate, wherein the end line portion is disposed on both the first substrate and the third substrate.

5. The display device mother substrate of claim 4, further comprising a third transmission line disposed on the third substrate, wherein the third transmission line and the end line portion of the first transmission line are electrically connected on the third substrate.

6. The display device mother substrate of claim 1, wherein one end of the end line portion is connected to a signal test pad.

7. A display device substrate, comprising:
an active area having an active area circuit disposed on a substrate; and
a first transmission line disposed on the substrate, the first transmission line comprising:
a display line portion having a first end and a second end, wherein the first end is electrically connected to a circuit of the active area, the second end extends to be exposed outside a first edge of the substrate; and
an end line portion disposed on the substrate and disconnected from the display line portion, wherein one end of the end line portion extends to be exposed outside the first edge of the substrate, a gap exists between the second end of the display line portion and the one end of the end line portion;
a second transmission line disposed on the substrate, wherein the second transmission line and the end line portion at least partially cross over each other.

8. A display device substrate comprising the first substrate of the display device mother substrate of claim 1 after the first substrate and the second substrate are separated.

9. A display device substrate comprising the second substrate of the display device mother substrate of claim 1 after the first substrate and the second substrate are separated.

* * * * *